(12) United States Patent
Mizoguchi (10) Patent No.: US 7,580,072 B2
(45) Date of Patent: Aug. 25, 2009

(54) SOLID-STATE IMAGING APPARATUS (75) Inventor: Toyokazu Mizoguchi, Minowa-machi (JP)

(73) Assignee: Olympus Corporation, Tokyo (JP)

( * ) Notice: Subject to any disclaimer, the term of this patent is extended or adjusted under 35 U.S.C. 154(b) by 253 days.

(21) Appl. No.: 11/822,592

(22) Filed: Jul. 9, 2007

(65) Prior Publication Data
US 2008/0018764 A1 Jan. 24, 2008

(30) Foreign Application Priority Data
Jul. 10, 2006 (JP) ............... 2006-188951

(51) Int. Cl.
H04N 3/14 (2006.01)
H04N 5/335 (2006.01)
H04N 5/235 (2006.01)
G03B 7/00 (2006.01)

(52) U.S. Cl. .............. 348/296; 348/308; 348/302; 348/294; 348/362

(58) Field of Classification Search ................ 348/296, 348/297
See application file for complete search history.

(56) References Cited

U.S. PATENT DOCUMENTS

| 6,731,335 B1 * | 5/2004 | Kim et al. | 348/308 |
| 6,867,806 B1 * | 3/2005 | Lee et al. | 348/308 |
| 2002/0080263 A1 * | 6/2002 | Krymski | 348/364 |
| 2005/0104983 A1 * | 5/2005 | Raynor | 348/294 |
| 2005/0110885 A1 * | 5/2005 | Altice et al. | 348/308 |
| 2006/0208285 A1 * | 9/2006 | Inoue et al. | 257/239 |
| 2008/0002043 A1 * | 1/2008 | Inoue et al. | 348/296 |

FOREIGN PATENT DOCUMENTS

JP  2002-320141 A  10/2002

* cited by examiner

Primary Examiner—Tuan V Ho
Assistant Examiner—Jason Flohre
(74) Attorney, Agent, or Firm—Westerman, Hattori, Daniels & Adrian, LLP.

(57) ABSTRACT

A solid-state imaging apparatus including: a pixel section having two-dimensionally arrayed pixels each having a first photoelectric conversion device and a second photoelectric conversion device located at positions regarded as the same position at which image is formed by an imaging optical system and a means for independently resetting each of signals accumulated at the first photoelectric conversion device and the second photoelectric conversion device; a reset control means for executing a resetting of the signal of all first photoelectric conversion devices of the pixel section as a first resetting operation, and executing, after a desired exposure time subsequent to the first resetting operation, a resetting of the signal of all second photoelectric conversion devices of said pixel section as a second resetting operation; a read means for reading simultaneously or almost simultaneously signals of the first photoelectric conversion device and the second photoelectric conversion device of each pixel starting immediately after the second resetting operation; and a difference signal output means for outputting as imaging signal the difference signal between the first photoelectric conversion device and the second photoelectric conversion device of said each pixel.

8 Claims, 11 Drawing Sheets

SOLID-STATE IMAGING APPARATUS

This application claims benefit of Japanese Patent Application No. 2006-188951 filed in Japan on Jul. 10, 2006, the contents of which are incorporated by this reference.

BACKGROUND OF THE INVENTION

The present invention relates to solid-state imaging apparatus having a concurrent shutter (hereinafter referred to as global shutter) function.

Figure 1:
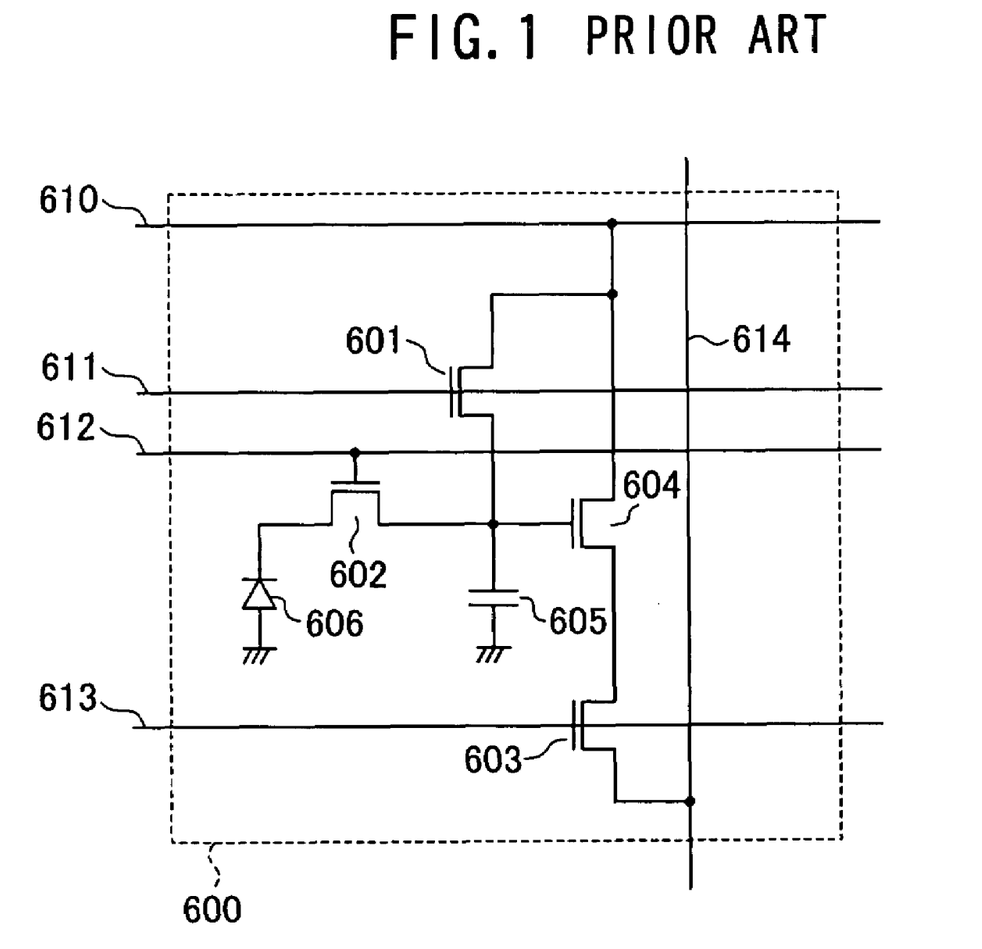
FIG. 1 is a circuit diagram showing construction of a single pixel of prior-art MOS solid-state imaging apparatus.

Conventionally, XY-addressing read methods are generally used to read pixel signals in MOS solid-state imaging apparatus. The construction of MOS solid-state imaging apparatus and XY-addressing read method thereof will be described below by way of FIGS. 1, 2 and 3. FIG. 1 shows a common pixel construction to be used in a MOS solid-state imaging apparatus. What is denoted by numeral 600 in FIG. 1 is a single pixel. Shown respectively therein are: 606, a photodiode serving as photoelectric conversion device; 602, a transfer transistor for transferring signal charge generated at photodiode 606 to a memory 605; 601, a reset transistor for resetting the memory 605 and photodiode 606; 604, an amplifier (amplification transistor) for amplifying and reading voltage level of the memory 605; and 603, a select transistor for selecting the pixel to transmit an output of the amplifier 604 to a vertical signal line 614. Here, those components but photodiode 606 are shielded from light.

Also referring to FIG. 1, denoted by numeral 610 is a pixel power supply, electrically connected to drain of the amplifier 604 and drain of the reset transistor 601. 611 is a reset line for resetting pixels corresponding to one row, which is electrically connected respectively to the gates of reset transistor 601 of the pixels corresponding to one row. 612 is a transfer line for transferring signal charge of the pixels corresponding to one row to the memory 605 of the respective pixels, which is electrically connected respectively to the gates of transfer transistor 602 corresponding to one row. 613 is a select line for selecting pixels corresponding to one row, which is electrically connected respectively to the gates of select transistor 603 corresponding to one row. Use of the pixel construction having four transistors in this manner (hereinafter referred to as 4-Tr pixel) achieves a photoelectric conversion function, reset function, amplification/read function, temporary memory function, and select function.

Figure 2:
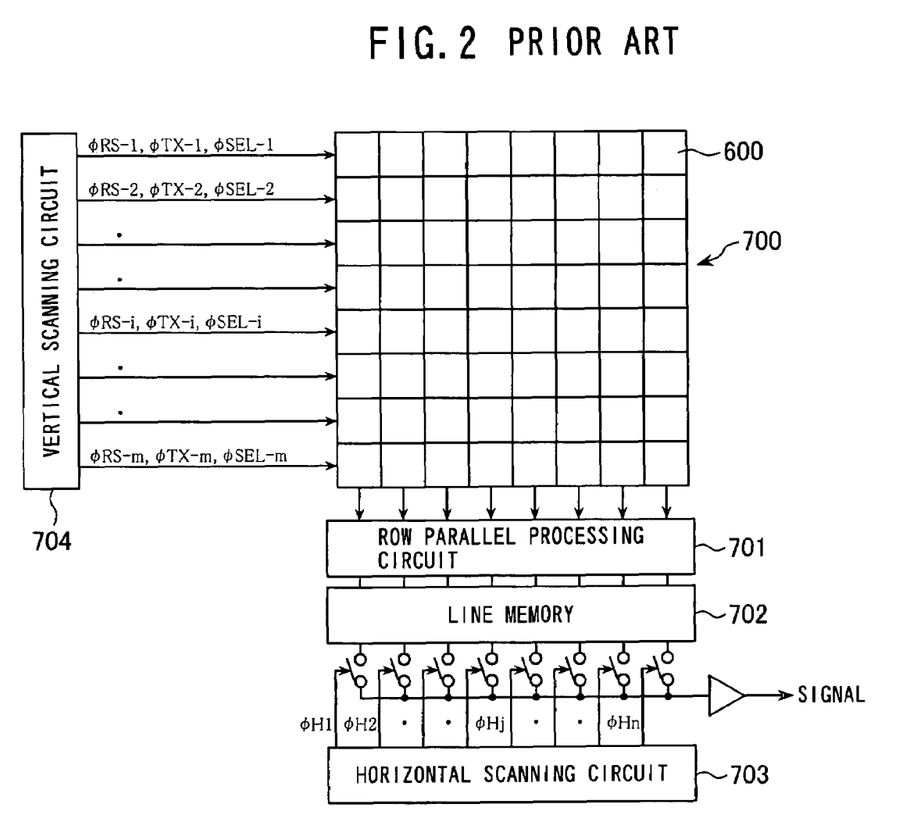
FIG. 2 is a block diagram showing an overall construction of MOS solid-state imaging apparatus using a conventional XY-addressing read method.

FIG. 2 shows a general fundamental construction of the solid-state imaging apparatus using the XY-addressing read method. A light receiving section is constituted by a pixel array 700 where pixels 600 having the pixel construction shown in FIG. 1 are arrayed in m-rows by n-columns. A vertical scanning circuit 704 scans the pixel array 700 while outputting to the pixel array 700 a row select signal φSELi (i=1, 2, 3, . . . m), row reset signal φRSi, and row transfer signal φTXi. At this time, the row select signal φSELi is transmitted to the gate of select transistor 603 of the pixels of i-th row through the select line 613, row reset signal φRSi is transmitted to the gate of reset transistor 601 of the pixels of i-th row through the reset line 611, and row transfer signal φTXi is transmitted to the gate of transfer transistor 602 of the pixels of i-th row through the transfer line 612.

When signals of the pixels of i-th row are to be read out, row select signal φSELi of i-th row is inputted to the pixel array 700 from the vertical scanning circuit 704. When photodiodes 606 of the pixels of i-th row are to be reset, row reset signal φRSi and transfer signal φTXi of i-th row are inputted to the pixel array 700 from the vertical scanning circuit 704. When the memory 605 of the pixels of i-th row are to be reset, row reset signal φRSi of i-th row is inputted to the pixel array 700 from the vertical scanning circuit 704. When signal charge of the pixels of i-th row is to be transferred to the memory 605, row transfer signal φTXi of i-th row is inputted to the pixel array 700 from the vertical scanning circuit 704.

Of the signals of the pixels of selected i-th row, after processing such as the canceling of FPN (fixed pattern noise) at a row parallel processing circuit 701, the results of processing are stored to a line memory 702. Subsequently, scanning and read are effected while sequentially selecting through a horizontal select switch the pixel signals corresponding to one row stored at the line memory 702 by the outputting a horizontal scanning signal φHj (j=1, 2, 3, . . . n) from a horizontal scanning circuit 703. By sequentially effecting this processing from the first row to m-th row, the signals of all pixels of the pixel array 700 can be scanned and read out.

Figure 3:
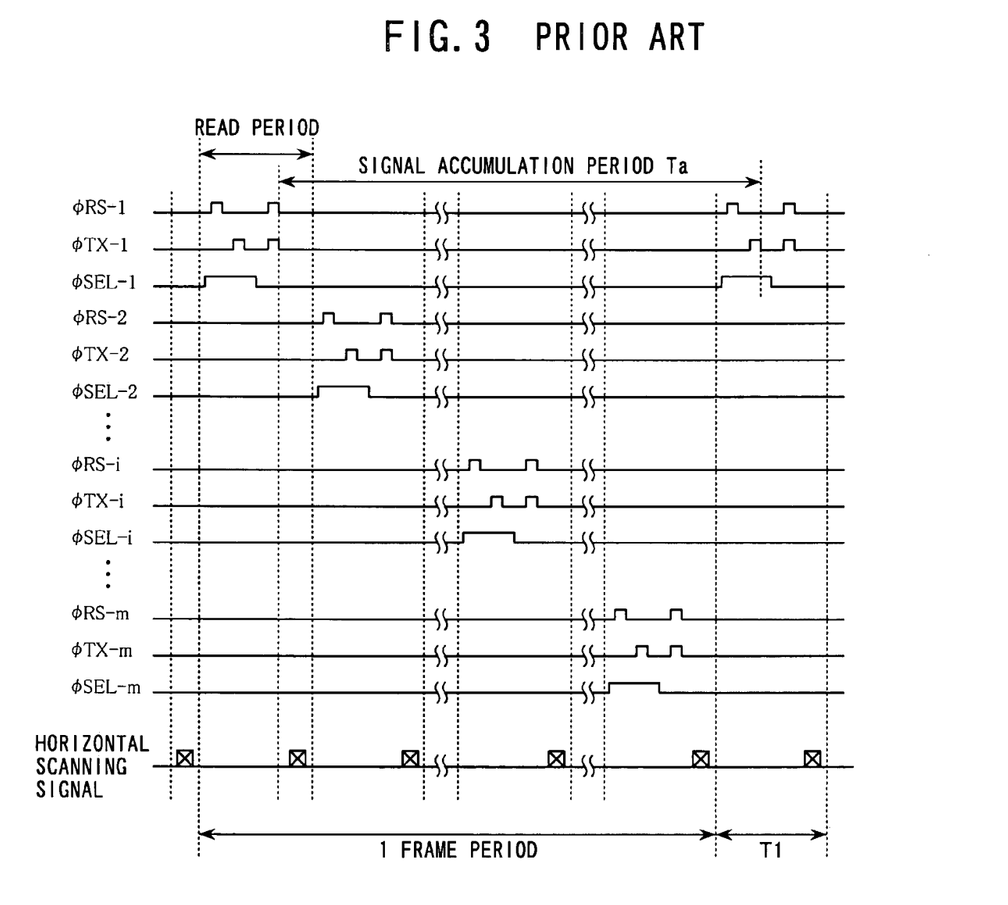
FIG. 3 is a timing chart for explaining operation of a normal XY-addressing read method of the MOS solid-state imaging apparatus shown in FIG. 2.

FIG. 3 is a timing chart showing drive timing of the solid-state imaging apparatus of such XY-addressing read method. The drive operation will be described with noticing the time interval of T1. As row select signal φSEL1 is outputted and the reset signal RS1 is then outputted from the vertical scanning circuit 704, pixels of the first row are selected and reset level of the pixels is read out. Further, as row transfer signal φTX1 is outputted from the vertical scanning circuit 704, signal charge generated at the photodiodes 606 of the first row is transferred to the memory 605 so that signal level of the pixels is read out. Subsequently, row reset signal φRS1 and row transfer signal φTX1 are outputted to reset the photodiode 606 and memory 605. The accumulation period of the signal read out here is the time interval indicated by Ta in the figure from immediately after the resetting of photodiode 606 in the previous frame to its transferring. Further, differential processing between the signal level and the reset level is effected during the period of T1, and such signal is stored to the line memory 702. After that, the signals of the first row are outputted by causing an operation of the horizontal scanning circuit 703 to output the horizontal scanning signal φHj (j=1, 2, 3, . . . n). Thereafter similar operation is effected of each row.

In such an ordinary XY-addressing read method (rolling shutter read method), since the point in time for accumulating signal is different from one row to another of the pixel array, or more specifically since a difference in the point in time corresponding to one frame at maximum exists between the first row to be read out first and the m-th row to be read out at the end, a distorted image problem occurs when a rapidly moving object is photographed.

Figure 4:
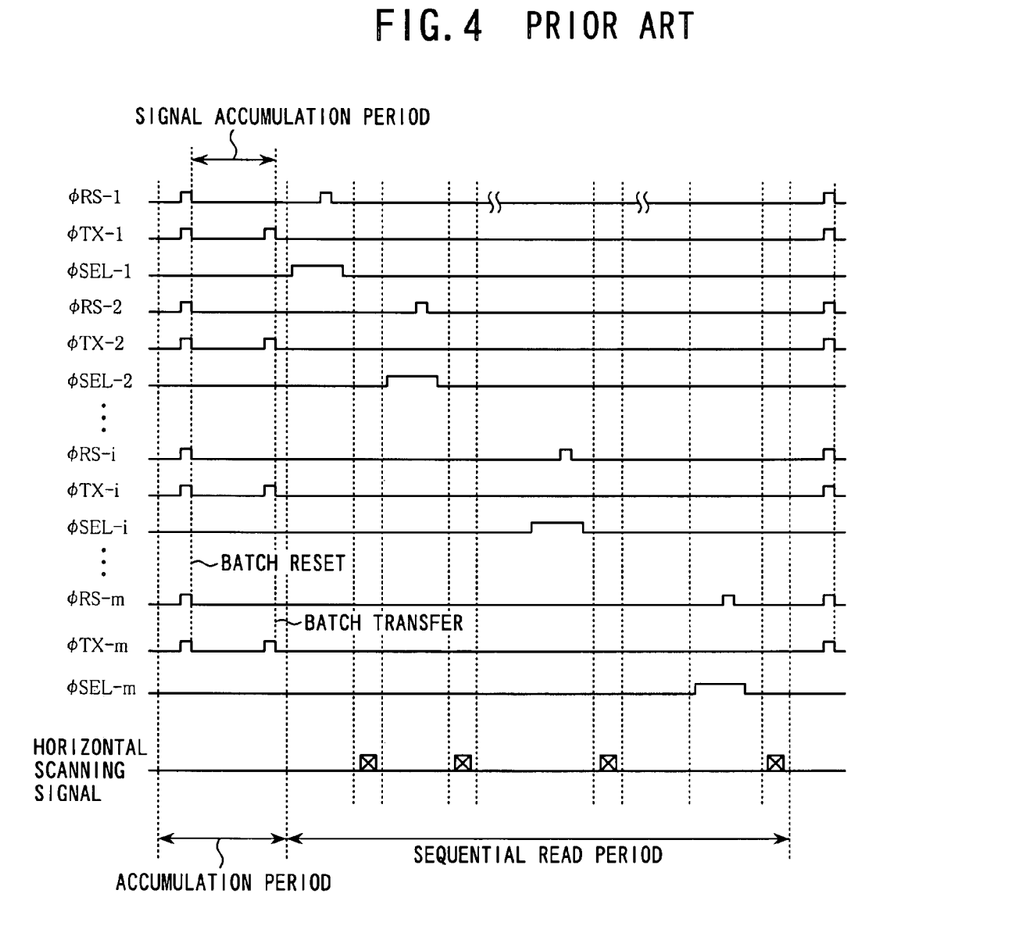
FIG. 4 is a timing chart in the case where the MOS solid-state imaging apparatus shown in FIG. 2 is caused to operate in a global shutter read method.

The global shutter read method is provided as a method for solving the above problem in the ordinary XY-addressing read method. Such read method will now be briefly described. FIG. 4 shows drive timing when global shutter operation is effected in a solid-state imaging apparatus having the same fundamental construction as the one shown in FIGS. 1 and 2.

First, as the row reset signals φRS1 to φRSm and row transfer signals φTX1 to φTXm of all the rows are simultaneously outputted from the vertical scanning circuit 704, photodiodes 606 of the pixels corresponding to all rows are reset. Subsequently, after a certain signal accumulation period, row transfer signals φTX1 to φTXm of all rows are simultaneously outputted from the vertical scanning circuit 704. The signal charges accumulated within the certain period at photodiodes 606 of the pixels corresponding to all rows are thereby transferred simultaneously for all rows to the memory 605. By such operation, the global shutter operation is effected.

A row-by-row readout of the signals stored at memory 605 is then started. First, as row select signal φSEL1 is outputted from the vertical scanning circuit 704, the pixels of the first row are selected and the signal level of the pixels are read out. Further, as row reset signal φRS1 is outputted from the vertical scanning circuit 704, the memory 605 of the first row is reset so that the reset level of the pixels is read out. When readout of the signal level and reset level of the pixels of the first row is complete, the pixels of the second row are selected and the signal level and reset level thereof are read out. By effecting this signal read scanning to m-th row, signals corresponding to one frame are read out. Although a horizontal scanning signal φHj of the horizontal scanning circuit 703 has not been shown for ease of explanation, the horizontal scanning signal φHj (j=1, 2, 3, . . . n) is outputted in an interval from the readout of the signals of i-th row to the readout of the signals of i+1-th row.

Japanese Patent Application Laid-Open 2002-320141 for example discloses a solid-state imaging apparatus using 4-Tr pixels, in which global shutter operation is effected.

SUMMARY OF THE INVENTION

In a first aspect of the present invention, there is provided a solid-state imaging apparatus including: a pixel section having two-dimensionally arrayed pixels each having a first photoelectric conversion device and a second photoelectric conversion device located at positions regarded as the same position at which image is formed by an imaging optical system and a means for independently resetting each of signals accumulated at the first photoelectric conversion device and the second photoelectric conversion device; a reset control means for executing a resetting of the signal of all first photoelectric conversion devices of the pixel section as a first resetting operation, and executing, after a desired exposure time subsequent to the first resetting operation, a resetting of the signal of all second photoelectric conversion devices of said pixel section as a second resetting operation; a read means for reading simultaneously or almost simultaneously signals of the first photoelectric conversion device and the second photoelectric conversion device of each pixel starting immediately after the second resetting operation; and a difference signal output means for outputting as imaging signal the difference signal between the first photoelectric conversion device and the second photoelectric conversion device of said each pixel.

In a second aspect of the invention, the solid-state imaging apparatus according to the first aspect, further includes a signal correction means for correcting characteristic difference between the first photoelectric conversion device and the second photoelectric conversion device and inputting to the difference signal output means.

In a third aspect of the invention, the first photoelectric conversion device and the second photoelectric conversion device of the solid-state imaging apparatus according to the first or second aspect are formed on the same semiconductor substrate.

In a fourth aspect of the invention, the pixel in the solid-state imaging apparatus according to any one aspect of the first to third aspects has a first transfer means and a second transfer means for transferring signals accumulated at the first photoelectric conversion device and the second photoelectric conversion device, and an amplification means for amplifying in common the signals transferred from the first transfer means and the second transfer means.

In a fifth aspect of the invention, the first photoelectric conversion device and the second photoelectric conversion device in the solid-state imaging apparatus according to any one aspect of the second to fourth aspects are different in size from each other.

In a sixth aspect of the invention, the difference signal output means of the solid-state imaging apparatus according to any on aspect of the first to fifth aspects is formed on the same semiconductor substrate as the pixel section.

In a seventh aspect of the invention, the difference signal output means and the signal correction means of the solid-state imaging apparatus according to any one aspect of the second to fifth aspects are formed on the same semiconductor substrate as the pixel section.

In an eighth aspect of the invention, the first photoelectric conversion device and the second photoelectric conversion device in the solid-state imaging apparatus according to the first or second aspect are formed on separate semiconductor substrates from each other.

DESCRIPTION OF THE PREFERRED EMBODIMENTS

Some embodiments of the solid-state imaging apparatus according to the invention will be described below with reference to the drawings.

Embodiment 1

Figure 5:
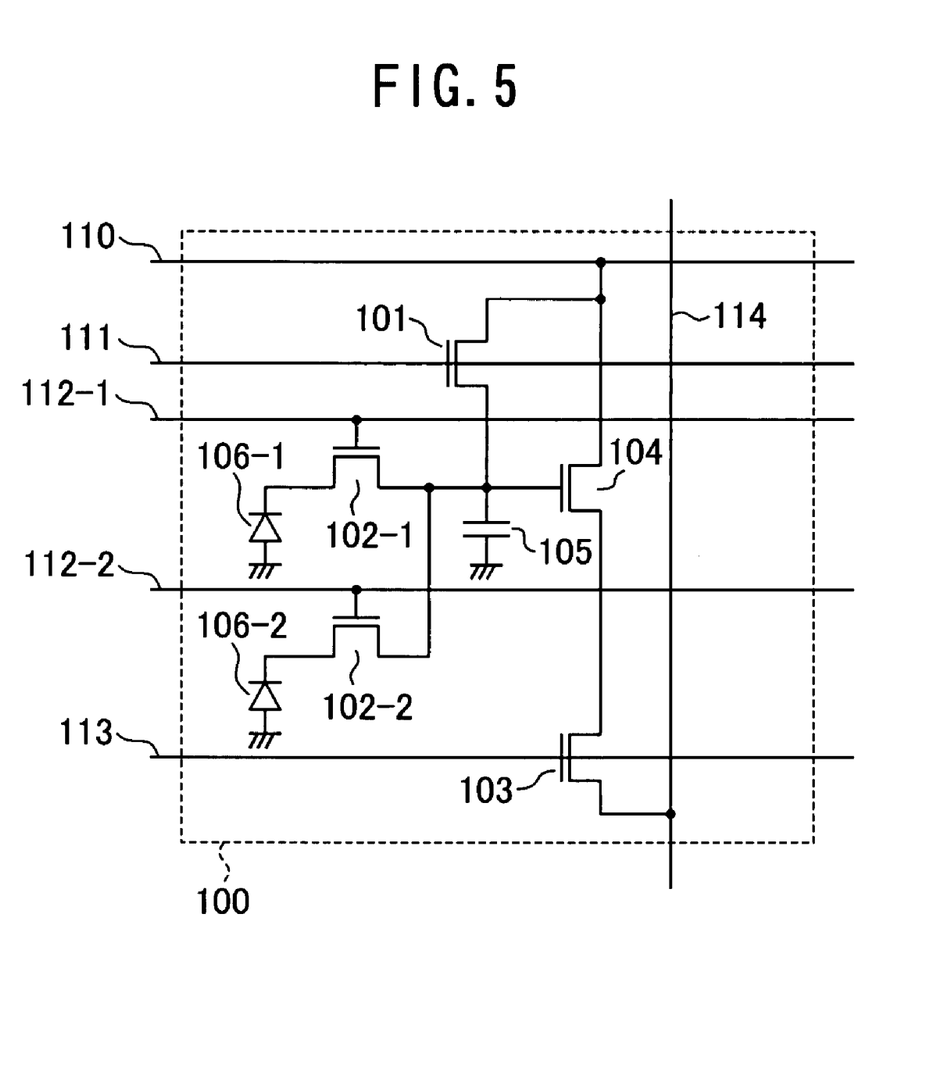
FIG. 5 is a circuit diagram showing construction of a single pixel in the pixel array of a first embodiment of the solid-state imaging apparatus according to the invention.

The solid-state imaging apparatus according to a first embodiment of the invention will now be described. FIG. 5 is a circuit diagram showing a pixel construction of the solid-state imaging apparatus according to the first embodiment. In FIG. 5, denoted by numeral 100 is a single pixel. The single pixel 100 in this embodiment has construction where two photodiodes are provided in the conventional 4-Tr construction unit pixel and two transfer transistors corresponding thereto are provided. In particular, it includes: a first photodiode 106-1 and a second photodiode 106-2; a first and a second transfer transistors 102-1, 102-2 for transferring signal charges generated at the first and second photodiodes 106-1, 106-2 respectively to the memory 105; a reset transistor 101 for resetting the memory 105, and first and second photodiodes 106-1, 106-2; an amplification transistor 104 for amplifying and reading voltage level of the memory 105; and a select transistor 103 for selecting the pixel to transmit an output of the amplification transistor 104 to a vertical signal line 114. Here the first and second photodiodes 106-1, 106-2 are provided as having the same size on the same one semiconductor substrate, at locations that are optically regarded as the same image forming position. Those components other than the first and second photodiodes 106-1, 106-2 are shielded from light.

It should be noted that, in FIG. 5, a pixel power supply 110 is electrically connected respectively to drain of the amplification transistor 104 and to drain of the reset transistor 101. Denoted by 111 is a reset line for resetting pixels corresponding to one row, which is electrically connected to gate of the reset transistor 101 of the pixels corresponding to one row. Denoted by 112-1 and 112-2 are a first and second transfer lines for transferring signal charges of the first photodiode 106-1 and the second photodiode 106-2 of the pixels corresponding to one row to memory 105 of the respective pixels, which are electrically connected respectively to the gates of the first and second transfer transistors 102-1, 102-2 of the pixels corresponding to one row. Denoted by 113 is a select line for selecting the pixels corresponding to one row, which is electrically connected to the gate of select transistors 103 corresponding to one row.

Figure 6:
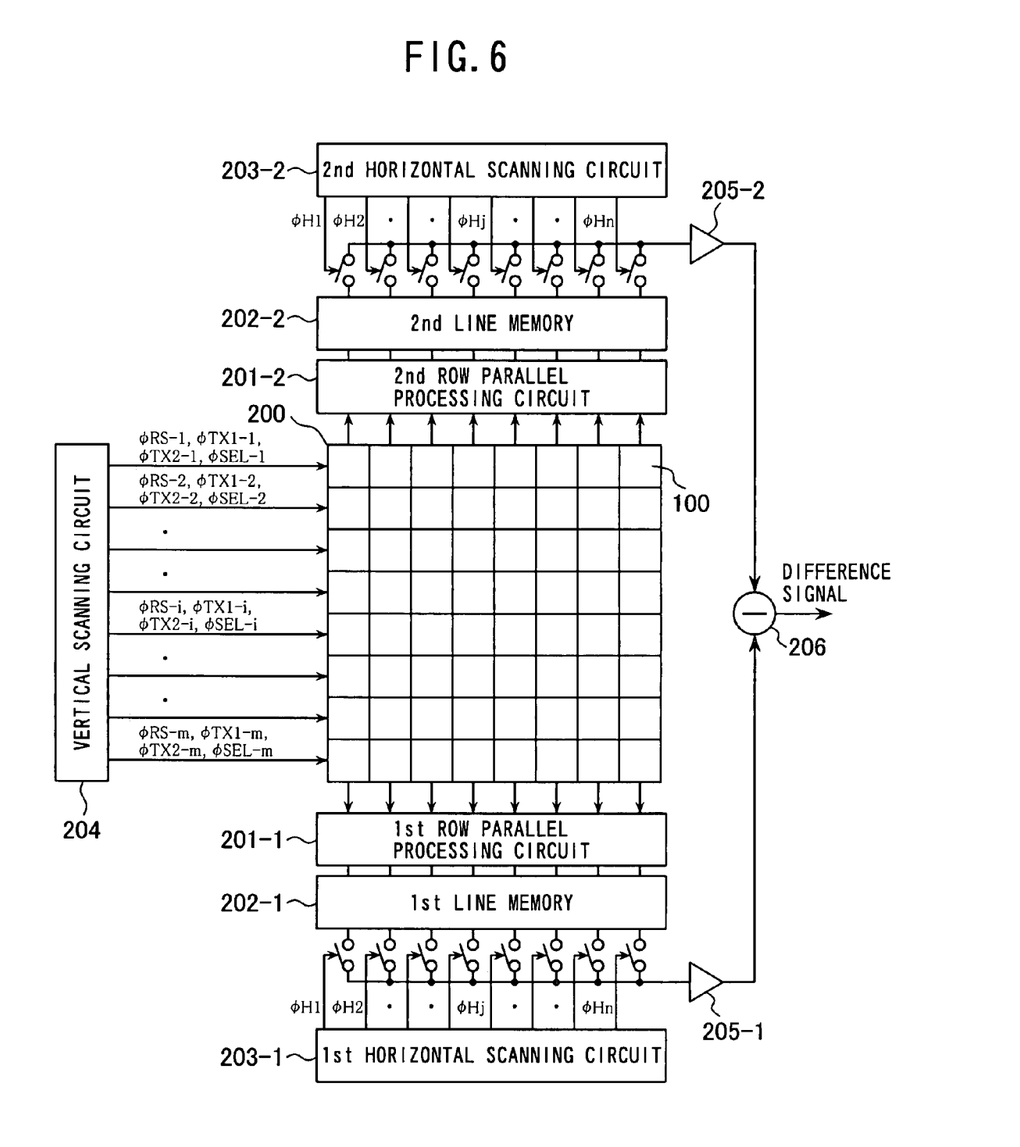
FIG. 6 is a block diagram showing an overall construction of the solid-state imaging apparatus according to the first embodiment of the invention.

FIG. 6 is block diagram showing an overall construction of the solid-state imaging apparatus according to the first embodiment having a pixel array 200 where single pixels 100 having the construction shown in FIG. 5 are arrayed in m-rows by n-columns. Referring to FIG. 6, denoted by 204 is a vertical scanning circuit for scanning the pixel array 200 while outputting the reset signal φRS-i, first and second transfer signals φTX1-i, φTX2-i, and row select signal φSEL-i respectively to the reset line 111, first and second transfer lines 112-1, 112-2, and select line 113. Denoted by 201-1 is a first row parallel processing circuit for effecting such processing as FPN cancel of the pixel signals from the first photodiode 106-1 of the pixels corresponding to one row; 202-1 is a first line memory for storing the processing result at the first row parallel processing circuit 201-1; and 203-1 is a first horizontal scanning circuit for scanning while sequentially selecting through a select switch the pixel signals of first photodiodes 106-1 corresponding to one row stored at the first line memory 202-1 so as to output them through a first amplifier 205-1.

Further denoted by 201-2 is a second row parallel processing circuit for effecting such processing as FPN cancel of the pixel signals from the second photodiode 106-2 of the pixels corresponding to one row; 202-2 is a second line memory for storing the processing result at the second row parallel processing circuit 201-2; and 203-2 is a second horizontal scanning circuit for scanning while sequentially selecting through a select switch the pixel signals of second photodiodes 106-2 corresponding to one row stored at the second line memory 202-2 so as to output them through the second amplifier 205-2. Denoted by 206 is a difference signal output means for causing an output of difference signal between the pixel signal from the first photodiode 106-1 outputted from the first amplifier 205-1 and the pixel signal from the second photodiode 106-2 outputted from the second amplifier 205-2. It should be noted that the first and second horizontal scanning circuits may be combined.

Figure 7:
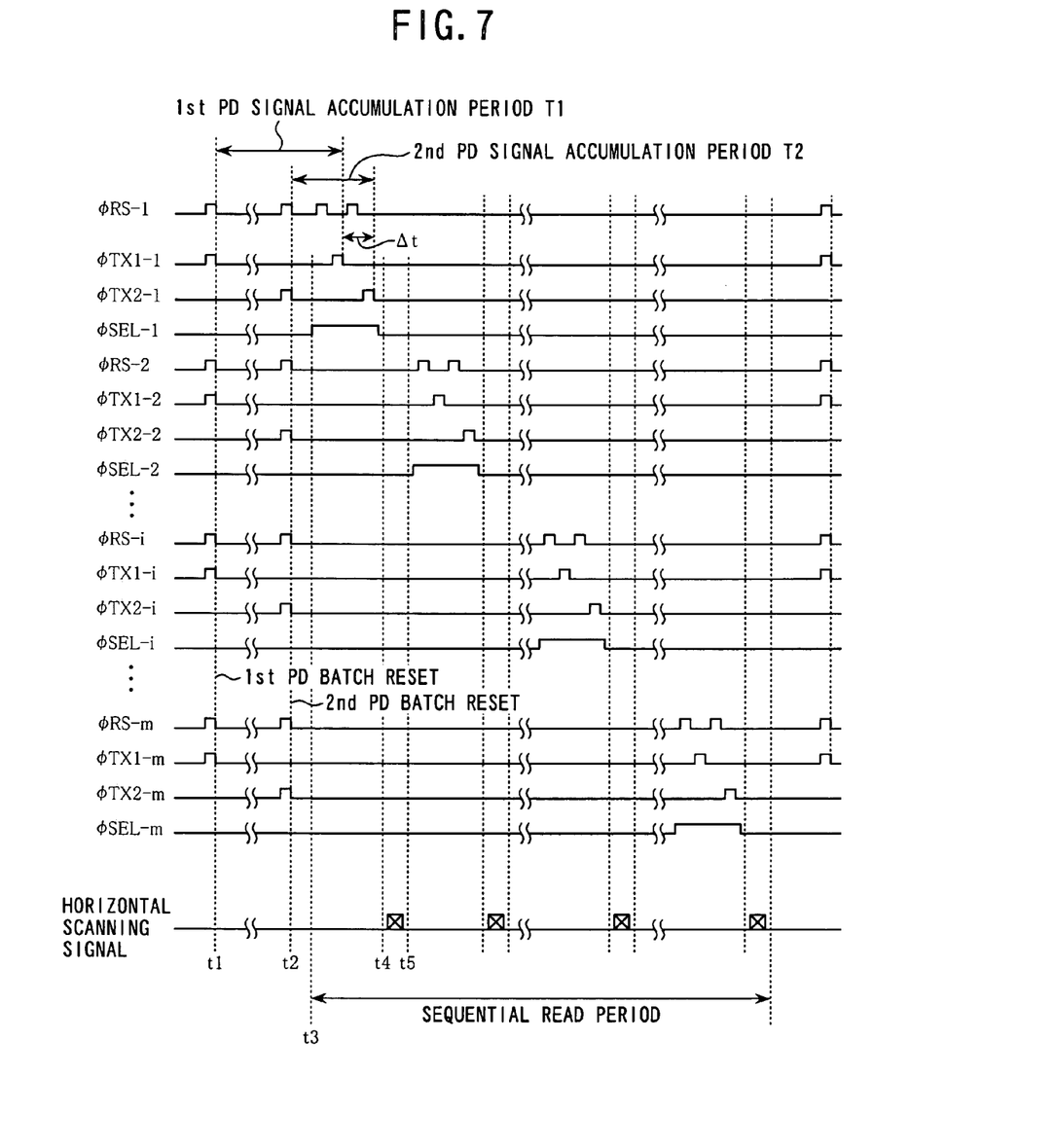
FIG. 7 is a timing chart for explaining operation of the solid-state imaging apparatus according to the first embodiment shown in FIG. 6.

An operation of thus constructed solid-state imaging apparatus according to the first embodiment will now be described with reference to the timing chart of FIG. 7. First at time t1, reset signal φRS-i and first transfer signal φTX1-i are inputted for all rows of the pixel array 200 to concurrently reset the first photodiode 106-1 and memory 105 of all pixels. Next at time t2 after passage of a predetermined time (exposure time), reset signal φRS-i and second transfer signal φTX2-i are inputted for all rows to concurrently reset the second photodiode 106-2 and memory 105 of all pixels.

Next at time t3, select signal φSEL-1 of the first row is inputted and then the first and second transfer signals φTX-1, φTX1-2 of the first row are respectively inputted to select and read the pixel signals of the first and second photodiodes 106-1, 106-2 of the pixels of the first row. Then respective processing is effected at the first and second row parallel processing circuits 201-1, 201-2, and the processing result of which is stored to the first and second line memories 202-1, 202-2. Next in a time interval from time t4 to t5, the pixel signals of the first row stored at the first and second line memories 202-1, 202-2 are concurrently read out by the first and second horizontal scanning circuits 203-1, 203-2 and are inputted to the difference signal output means 206. The difference signal between the first and second photodiodes 106-1, 106-2 is then outputted as the pixel signal of the first row by the differential processing at the difference signal processing means 206. Similarly thereafter, the pixel signals of the second row and after are sequentially outputted.

At this time, the period from point in time t1 at which the first photodiodes 106-1 are concurrently reset to the inputting of the next first transfer signal φTX1-1 of the first row is a signal accumulation period T1 of the first photodiode 106-1. On the other hand, the period from point in time t2 at which the second photodiodes 106-2 are cocurrently reset to the inputting of the next second transfer signal φTX2-1 of the first row is a signal accumulation period T2 of the second photodiode 106-2. Then the time difference Δt between the respective inputting of the first and second transfer signals φTX1-1, φTX1-2 of the second time is very short as compared to the period (T1-T2). Accordingly, the difference signal between the first and second photodiodes 106-1, 106-2 outputted from the difference signal output means 206 becomes the signals in the difference between the signal accumulation period T1 of the first photodiode 106-1 and the signal accumulation period T2 of the second photodiodes 106-2, or in other words consists only of the signal by the accumulation charge in a predetermined period (exposure period) between the concurrent (batch) reset time (t1) of the first photodiodes 106-1 and the concurrent (batch) reset time (t2) of the second photodiode 106-2.

It is thereby possible to make uniform the exposure time of all pixels so that signals of a batch exposure can be obtained. Since the signal read method itself in this embodiment is identical to the conventional rolling shutter method, the problem of dark current is eliminated, and KTC noise (noise occurring when photodiode is reset) is also eliminated. Accordingly, a solid-state imaging apparatus capable of achieving global shutter function is obtained without deteriorating S/N of the imaging signal output by the effect of dark current or KTC noise.

Embodiment 2

Figure 8:
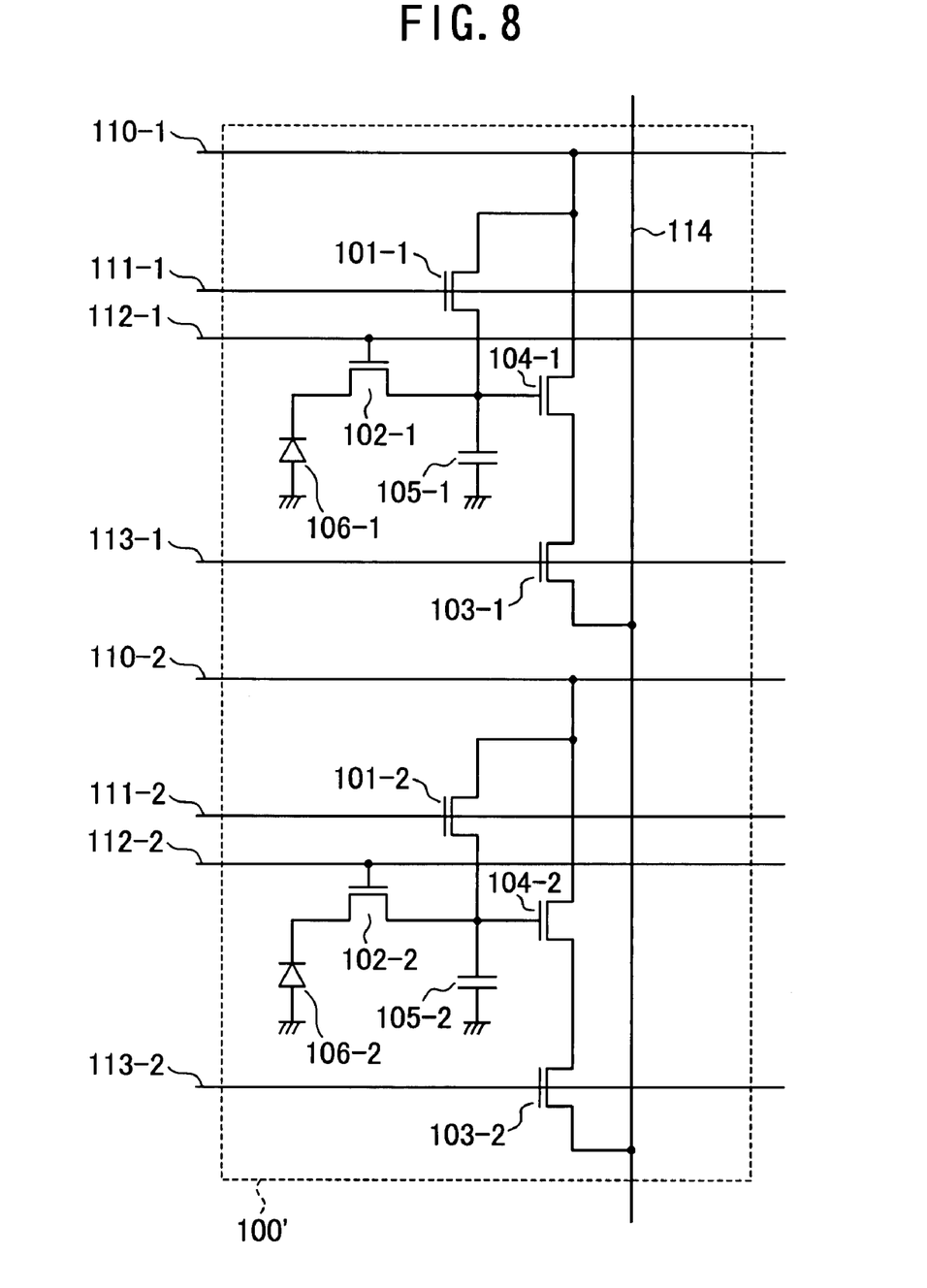
FIG. 8 is a circuit diagram showing construction of a single pixel of the solid-state imaging apparatus according to a second embodiment of the invention.

A second embodiment of the invention will now be described. FIG. 8 is a circuit diagram showing a pixel construction of the solid-state imaging apparatus according to the second embodiment. In FIG. 8, denoted by 100' is a single pixel. The single pixel 100' in this embodiment has construction where two unit pixels having the conventional 4-Tr construction are simply placed side by side into a combination. In particular, it includes: a first photodiode 106-1 and a second photodiode 106-2; a first and second transfer transistors 102-1, 102-2 for transferring signal charges generated at the first and second photodiodes 106-1, 106-2 respectively to a first and second memories 105-1, 105-2; a first and second reset transistors 101-1, 101-2 for resetting the first and second memories 105-1, 105-2, and the first and second photodiodes 106-1, 106-2; a first and second amplification transistors 104-1, 104-2 for amplifying and reading out the voltage level of the first and second memories 105-1, 105-2; and a first and second select transistors 103-1, 103-2 for selecting pixels to transmit output of the first and second amplification transistors 104-1, 104-2 to a vertical signal line 114. Also in this case, the first and second photodiodes 106-1, 106-2 are provided as having the same size on the same one semiconductor substrate, at locations that are optically regarded as the same image forming position, and those components other than the first and second photodiodes 106-1, 106-2 are shielded from light.

It should be noted that, in FIG. 8, pixel power supplies 110-1 and 110-2 are electrically connected respectively to drains of the first and second amplification transistors 104-1, 104-2 and to drains of the first and second reset transistors 101-1, 101-2. Denoted by 111-1 and 111-2 are a first and second reset lines for resetting pixels corresponding to one row, which are electrically connected respectively to gates of the first and second reset transistors 101-1, 102-2 of the pixels corresponding to one row. Denoted by 112-1 and 112-2 are a first and second transfer lines for transferring signal charges of the first photodiode 106-1 and the second photodiode 106-2 of the pixels corresponding to one row to the first and second memories 105-1, 105-2 of the respective pixels, which are electrically connected respectively to the gates of the first and second transfer transistors 102-1, 102-2 of the pixels corresponding to one row. Denoted by 113-1 and 113-2 are a first and second select lines for selecting pixels corresponding to one row, which are electrically connected respectively to the gates of the first and second select transistors 103-1, 103-2 corresponding to one row.

Figure 9:
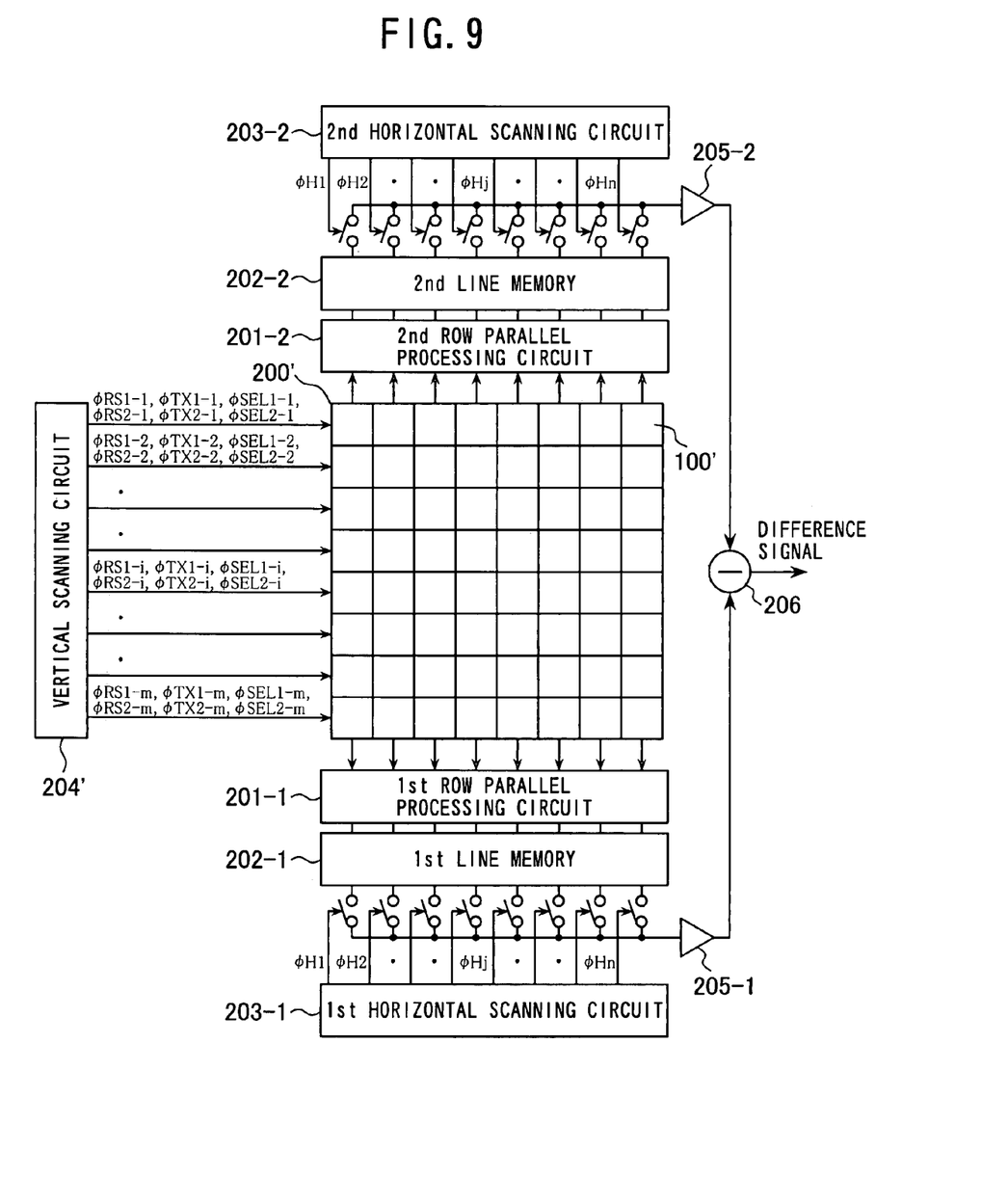
FIG. 9 is a block diagram showing an overall construction of the solid-state imaging apparatus according to the second embodiment of the invention.

FIG. 9 is a block diagram showing an overall construction of the solid-state imaging apparatus according to the second embodiment having a pixel array 200' where single pixels 100' having the construction shown in FIG. 8 are arrayed in m-rows by n-columns. Referring to FIG. 9, denoted by 204' is a vertical scanning circuit for scanning the pixel array 200' while outputting the first and second reset signals φRS1-$i$, φRS2-$i$, first and second transfer signals φTX1-$i$, φTX2-$i$, and first and second row select signals φSEL1-$i$, φSEL2-$i$, respectively, to the first and second reset lines, first and second transfer lines, and first and second select lines. The second embodiment is different from the first embodiment shown in FIG. 6 only in construction of the above described pixel array 200' and the vertical scanning circuit 204'. The construction of the other portions thereof are identical to the construction of the solid-state imaging apparatus according to the first embodiment shown in FIG. 6 and will not be described.

Also in the solid-state imaging apparatus according to thus constructed second embodiment, similarly to the solid-state imaging apparatus according to the first embodiment shown in FIG. 6, the first row reset signal φRS1-$i$ and first transfer signal φTX1-$i$ are inputted to all rows to concurrently reset the first photodiode 106-1 of all pixels, and, after a predetermined time (exposure time), the second row reset signal φRS2-$i$ and second transfer signal φTX2-$i$ are inputted to all rows to concurrently reset the second photodiode 106-2 of all pixels. After that, signals of the first photodiode 106-1 and the second photodiode 106-2 are concurrently read out row by row, and difference between the signal of first photodiode 106-1 and the signal of second photodiode 106-2 is obtained at the difference signal output means 206. It is thereby possible to obtain a concurrent exposure signals of all pixels where exposure time is uniformed corresponding to time from the concurrent resetting of the first photodiode 106-1 to the concurrent resetting of the second photodiode 106-2.

In the above described first and second embodiments, the first photodiode and the second photodiode in a single pixel have been shown as having the same size with the same electric characteristic, etc. It is however preferable to make the main photodiode to have a greater size to improve sensitivity of pixel and to increase saturation charge amount.

A description will thus be given as a third embodiment of the solid-state imaging apparatus using a pixel array consisting of single pixels where size of the first photodiode serving as the main photodiode in a single pixel is made larger and size of the second photodiode for outputting the signal to be subtracted from the signal of the first photodiode is made as small as possible.

Embodiment 3

Figure 10:
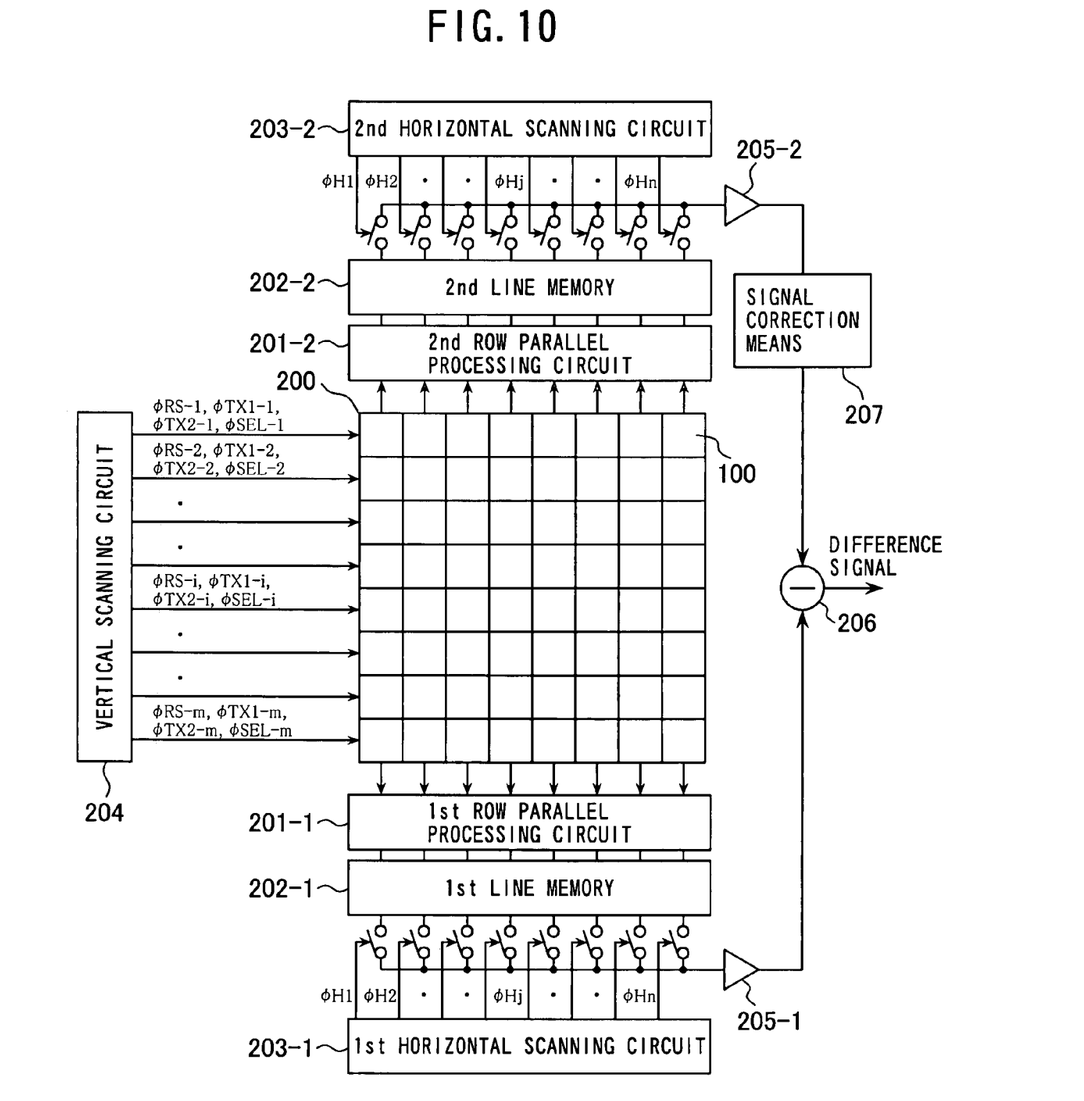
FIG. 10 is a block diagram showing an overall construction of the solid-state imaging apparatus according to a third embodiment of the invention.

FIG. 10 is a block diagram showing construction of the solid-state imaging apparatus according to the third embodiment. In the third embodiment, size of the first photodiode in the single pixels 100 constituting the pixel array 200 is made larger, and size of the second photodiode as small as possible. For this reason, a signal correction means 207 is provided, in which correction of characteristic difference such as the providing of a gain on the input side of signal of the second photodiode having smaller output of the difference signal output means 206 is effected in subtracting the signal of second photodiode from the signal of first photodiode at the difference signal output means 206. The signal of the second photodiode is thereby corrected and then subtracted.

With such construction, even when there is a difference in electrical characteristic between the first photodiode and the second photodiode in one pixel, such characteristic difference can be corrected to obtain a difference signal so that imaging signals of higher quality and higher sensitivity can be obtained. It should be noted that, while the signal correction means in the third embodiment has been shown as one provided on the input side of the signal of the second photodiode of the difference signal output means, the signal correction means may be provided additionally also on the input side of the signal of the first photodiode.

In the third embodiment, on the premise that the first photodiode and the second photodiode in each pixel are made in different size, the signal correction means has been provided to correct such characteristic difference. Even in the case where the first photodiode and the second photodiode in each pixel are made as having the same size, however, a difference in electrical or optical characteristic may occur for example due to shift in their position. Also in such case, the correction of characteristic difference with providing the signal correction means is effective to obtain high-quality imaging signals.

Further, in the above embodiments, the difference signal output means may be formed on the same one semiconductor substrate as the imaging device section which includes a pixel array and its peripheral circuits, or it may be formed on a separate member from the imaging device section. Also in the third embodiment shown in FIG. 10, the difference signal output means and the signal correction means may be formed either on the same semiconductor substrate as the imaging device section or on a separate member.

In the above embodiments, the first photodiode and the second photodiode have been shown as those provided on the same one semiconductor substrate (single-sensor construction). The first photodiode and the second photodiode, however, may be formed on different semiconductor substrate from each other. In other words, the solid-state imaging apparatus may be of 2-sensor construction consisting of a first solid-state imaging device to be used as the first photodiode and a second solid-state imaging device to be used as the second photodiode.

Embodiment 4

Figure 11:
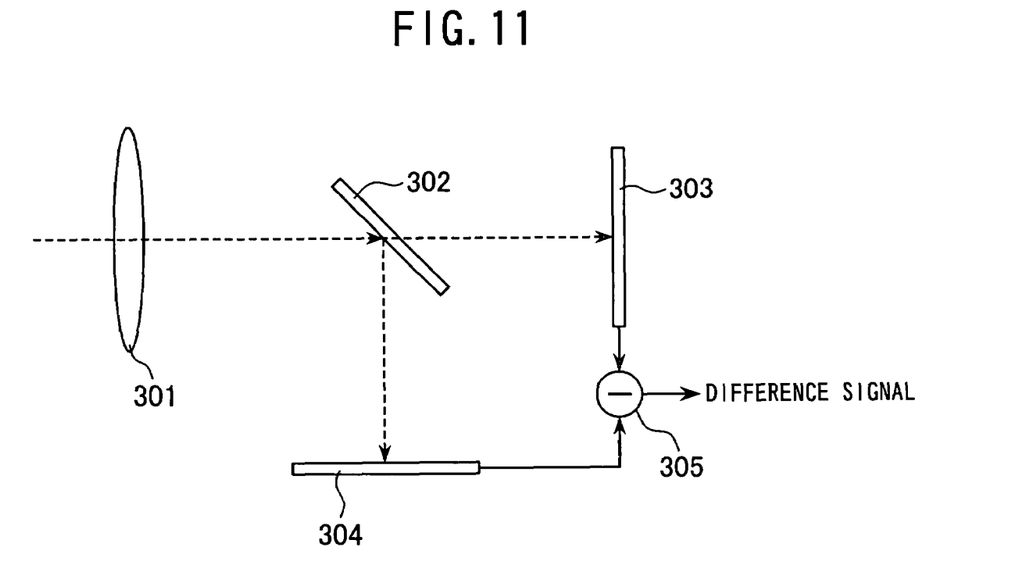
FIG. 11 schematically shows construction of the solid-state imaging apparatus according to a fourth embodiment of the invention.

The construction of such solid-state imaging apparatus will now be described by way of FIG. 11 as a fourth embodiment of the invention. As shown in FIG. 11, an object light from taking lens 301 is caused to be incident through a half-mirror 302 in a manner divided onto a first solid-state imaging device 303 to be used as the first photodiode and a second solid-state imaging device 304 to be used as the second photodiode. The signal of the first photodiode and signal of the second photodiode outputted from the pixels at the same image forming position that correspond to each other between the two solid-state image forming devices 303, 304 are inputted to the difference signal output means 305 so that a difference signal can be obtained.

Here, although a signal correction means is not necessary when transmittance of the half-mirror 302 is ½, the signal correction means as shown in the third embodiment of FIG. 10 is provided so as to correct signal to be inputted to the difference signal output means 305 when the transmittance of the half-mirror 302 is made not to be ½.

Also, while examples using the MOS type as pixel have been shown in the above embodiments, the pixel construction is not limited to those of MOS type, and the present invention may also be applied to those solid-state imaging apparatus where pixels consisting of CMD (Charge Modulation Device) for example are used.

Further in any of the embodiments, it is possible to effect the conventional rolling shutter operation by controlling the reset, signal transfer, signal read of the first photodiode and the second photodiode simultaneously at the timing of a rolling shutter operation. In such case, the difference signal output means is not used, and a switch is provided at the input thereof so as to directly obtain the signal outputs of the first photodiode and the second photodiode.

As has been described by way of the above embodiments, with the solid-state imaging apparatus according to the first aspect of the invention, since photoelectric conversion signal is accumulated only at the photoelectric conversion device, a solid-state imaging apparatus using a global shutter method can be achieved without increasing dark current level as compared to the conventional solid-state imaging apparatus using a rolling shutter method. Also, since the same method as the conventional solid-state imaging apparatus of rolling shutter method can be employed as the method of reading the signal of the photoelectric conversion device, it is possible to cancel KTC noise and FPN. Further, since it is possible to apply the same manufacturing process as the conventional solid-state imaging apparatus of rolling shutter method, an increase in manufacturing cost does not occur.

With the solid-state imaging apparatus according to the second aspect of the invention, even when there is a difference in electric/optical characteristic between the first photoelectric conversion device and the second photoelectric conversion device, it can be corrected in obtaining a difference signal so that imaging signals of higher quality can be obtained.

With the solid-state imaging apparatus according to the third aspect of the invention, since the solid-state imaging apparatus according to the first or second aspect can be achieved by a single device, size of the solid-state imaging apparatus can be reduced.

With the solid-state imaging apparatus according to the fourth aspect of the invention, since the number of members constituting the pixel can be reduced, the photoelectric conversion device may be increased in size so that the solid-state imaging apparatus according to the first to third aspects can be achieved with an excellent photoelectric conversion characteristic.

With the solid-state imaging apparatus according to the fifth aspect of the invention, size of the first photoelectric conversion device can be made greater as compared to the size of the second photoelectric conversion device so that the solid-state imaging apparatus according to the second to fourth aspects can be achieved with even more excellent photoelectric conversion characteristic.

With the solid-state imaging apparatus according to the sixth or seventh aspect of the invention, since the solid-state imaging apparatus may be formed on one chip, size of the solid-state imaging apparatus can be reduced.

With the solid-state imaging apparatus according to the eighth aspect of the invention, since the size of photoelectric conversion device occupying a portion of one pixel can be made equivalent to that of the conventional solid-state imaging apparatus using a rolling shutter method, the solid-state imaging apparatus using a global shutter method can be achieved as having equivalent photoelectric conversion characteristic as the conventional solid-state imaging apparatus of rolling shutter method. Further, since the same method as that of the conventional solid-state imaging apparatus of rolling shutter method can be employed as the method for reading the signal of photoelectric conversion device, KTC noise and characteristic variance of each pixel (FPN) can be canceled.

What is claimed is:

1. A solid-state imaging apparatus comprising:
a pixel section having two-dimensionally arrayed pixels each having a first photoelectric conversion device and a second photoelectric conversion device located at positions regarded as the same position at which image is formed by an imaging optical system and a means for independently resetting each of signals accumulated at said first photoelectric conversion device and said second photoelectric conversion device;
a reset control means for executing a resetting of the signal of all first photoelectric conversion devices of said pixel section as a first resetting operation, and executing, after a desired exposure time subsequent to said first resetting operation, a resetting of the signal of all second photoelectric conversion devices of said pixel section as a second resetting operation;

a read means for reading simultaneously or almost simultaneously signals of the first photoelectric conversion device and the second photoelectric conversion device of each pixel starting immediately after the second resetting operation; and a difference signal output means for outputting as imaging signal the difference signal between the first photoelectric conversion device and the second photoelectric conversion device of said each pixel.

2. The solid-state imaging apparatus according to claim 1, further comprising a signal correction means for a correcting characteristic difference between said first photoelectric conversion device and second photoelectric conversion device and inputting to said difference signal output means.

3. The solid-state imaging apparatus according to claim 1, wherein said first photoelectric conversion device and second photoelectric conversion device are formed on the same one semiconductor substrate.

4. The solid-state imaging apparatus according to claim 1, wherein said pixel further comprises a first transfer means and a second transfer means for transferring signals accumulated at said first photoelectric conversion device and second photoelectric conversion device, and an amplification means for amplifying in common the signals transferred from said first transfer means and second transfer means.

5. The solid-state imaging apparatus according to claim 2, wherein said first photoelectric conversion device and second photoelectric conversion device are different in size from each other.

6. The solid-state imaging apparatus according to claim 1, wherein said difference signal output means is formed on the same one semiconductor substrate as the pixel section.

7. The solid-state imaging apparatus according to claim 2, wherein said difference signal output means and said signal correction means are formed on the same one semiconductor substrate as said pixel section.

8. The solid-state imaging apparatus according to claim 1, wherein said first photoelectric conversion device and second photoelectric conversion device are formed on separate semiconductor substrates from each other.

* * * * *